United States Patent [19]

Turner

[11] Patent Number: 4,763,073
[45] Date of Patent: Aug. 9, 1988

[54] METHOD AND APPARATUS FOR THE RECONSTRUCTION OF NUCLEAR MAGNETIC RESONANCE IMAGES

[75] Inventor: Robert Turner, Bramcote, England

[73] Assignee: National Research Development Corporation, London, England

[21] Appl. No.: 844,165

[22] Filed: Mar. 26, 1986

[30] Foreign Application Priority Data

Mar. 28, 1985 [GB] United Kingdom ............ 8508154

[51] Int. Cl.$^4$ ............................................. G01R 33/20
[52] U.S. Cl. ....................................... 324/312; 324/309
[58] Field of Search .................... 324/77 K, 312, 309; 350/162.12; 382/34

[56] References Cited

U.S. PATENT DOCUMENTS 3,697,149 10/1972 Van Heeckeren et al. ..... 350/162.12
4,340,862 7/1982 Percival et al. ................... 324/312

FOREIGN PATENT DOCUMENTS

85/01362 3/1985 PCT Int'l Appl. .
1525564 9/1978 United Kingdom .
1596160 8/1981 United Kingdom .

OTHER PUBLICATIONS

Filtering Operations Using Coherent Optics, L. J. Cutrona et al., Proc. of Nat. Electronics Conference, vol. 15, 1959.
Article from "Optical Engineering", vol. 24, No. 1, Jan./Feb. 1985 entitled Electron–Beam–Addressed Microchannel Spatial Light Modulator, pp. 119–123.

Primary Examiner—Stewart J. Levy
Assistant Examiner—Louis M. Arana
Attorney, Agent, or Firm—Cushman, Darby & Cushman

[57] ABSTRACT

In NMR imaging method and apparatus the free induction signal obtained from a slice in an object is detected in a quadrature receiver and is modulated in a modulator and then displayed in a video display and photographed by a camera. The photograph is viewed in coherent light and the image represents the Fourier transformation of the free induction signal and hence is an image of the NMR spin density distribution of selected nuclei in the slice. As an alternative, modulation may be produced by providing a constant offset to the main magnetic field.

11 Claims, 1 Drawing Sheet

METHOD AND APPARATUS FOR THE RECONSTRUCTION OF NUCLEAR MAGNETIC RESONANCE IMAGES

FIELD OF THE INVENTION

This invention relates to methods and apparatus for the reconstruction of nuclear magnetic resonance images.

BACKGROUND OF THE INVENTION

Methods and apparatus are known by which images are produced representing the spin density distribution of selected nuclei in an object. For this purpose the free induction signals which are generated after nuclear magnetic resonance are detected in the presence of a magnetic field gradient. The detected signal is subjected to a Fourier transform operation to convert the signal from the time domain to the frequency domain and this gives a distribution of the spin density along the direction of the gradient. Various techniques are known by which a two dimensional image can be obtained. Thus, in one proposal a series of one dimensional projections of an object in different directions are obtained and an image is built up by projection reconstruction. In another technique, a slice in the object is preselected by selective irradiation as described in British Pat. No. 1525564, (corresponding to U.S. Pat. No. 4,021,726) also as described in examples in that patent an image of the slice can be built up line-by-line, or else for example an echo planar technique can be used as described in British Pat. No. 1596160 (corresponding U.S. Pat. No. 4,165,479) to obtain image information relating to an entire preselected slice. However, in all cases a Fourier transformation of the detected free induction signal must be carried out. While this can be readily achieved by the use of a digital computer, it requires a relatively expensive computer and takes a noticeable amount of time. This transformation step constitutes the most exacting technical requirement for the computer facilities in an imaging system.

SUMMARY OF THE INVENTION

It is an object of the invention to provide method and apparatus by which the operation of Fourier transformation can be simplified.

According to the invention, in one aspect a method of providing nuclear magnetic resonance images, wherein a free induction signal from nuclei in an object under investigation obtained in the presence of a homogeneous magnetic field on which a magnetic gradient field is superimposed is subjected to a Fourier transformation, comprises the steps of modulating the free induction signal by a reference signal, presenting the modulated signal as a hologram and viewing the hologram in coherent light.

Preferably the signal is derived from a slice in the object lying in a plane orthogonal to the direction of the gradient.

In carrying out the invention, the modulation may be carried out after detection of the free induction signal. Conveniently, the detected signal is first digitized and the modulation then carried out in a computer operation on the digitized signal. Alternatively, modulation may be performed by providing a fixed offset to the homogeneous magnetic field, in which case no digitization is necessary.

In embodiments of the invention the hologram may comprise variations in optical density of a photographic film.

According to the invention in another aspect, apparatus for providing nuclear magnetic resonance images, wherein a free induction signal from nuclei in an object under investigation obtained in the presence of a homogeneous magnetic field on which a magnetic gradient field is superimposed is subjected to a Fourier transformation, comprises means for modulating the free induction signal by a reference signal, means for presenting the modulated signal as a hologram and means for illuminating the hologram with coherent light.

Preferably means are provided for preselecting a slice in the object lying in a plane orthogonal to the direction of the gradient.

The modulation means may modulate the free induction signal after detection. Means may be provided for digitizing the detected free induction signal before modulation, in which case the modulation means operates on digital data.

The invention makes use of the relationship that the amplitude of a light-wave in one focal plane of a lens is the Fourier transform of the wave in the other focal plane. This relationship forms the basis of holography where an image of the Fourier transform of the visual appearance of an object is stored in a photographic film in such a way that illumination by coherent light reconstructs for the eye an image of the original object.

BRIEF DESCRIPTION OF THE DRAWINGS

In order that the invention may be more fully understood reference will now be made to the accompanying drawing in which.

DETAILED DESCRIPTION OF THE INVENTION

Figure 1:
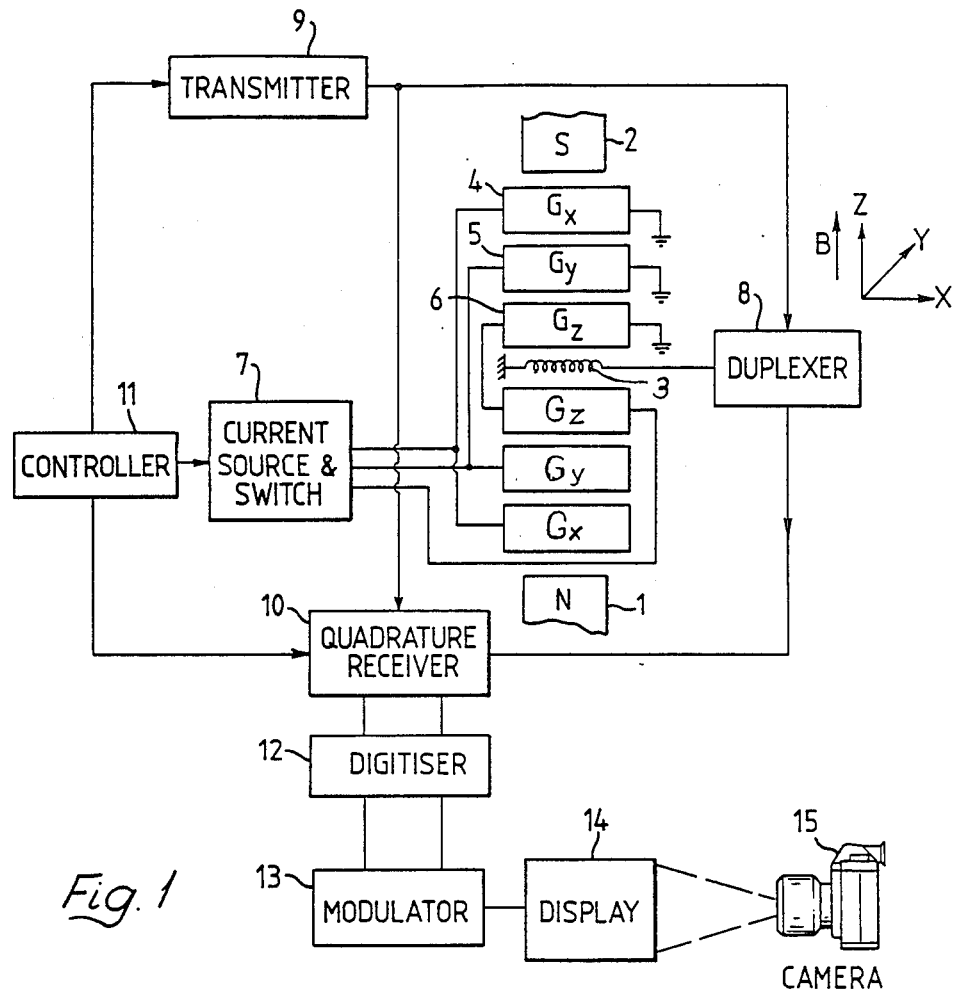
FIG. 1 is a block diagram of NMR imaging apparatus.

Referring now to FIG. 1 there is shown therein NMR imaging apparatus. Such apparatus includes a large powerful magnet indicated by the N and S pole pieces 1 and 2. A steady magnetic field B exists in the gap between the pole pieces and an object or sample, the NMR image of which it is desired to obtain, is positioned in the gap. Co-ordinates X, Y and Z are defined with the magnetic field B extending in the Z direction. The object is surrounded by an rf coil 3 and three sets of gradient coils 4, 5 and 6 are provided to give gradients, to the magnetic field B, of Gx in the X direction, Gy in the Y direction and Gz in the Z direction. Gradient coils 4, 5 and 6 are supplied from a current source and switch 7, by which any set of gradient coils can be energized to superimpose corresponding magnetic field gradients on the main field B.

RF coil 3 is supplied through a duplexer 8 from a transmitter 9 and any NMR signals picked up in coil 3, as a result of the RF energization in the presence of appropriate magnetic field gradient, will be directed through duplexer 8 to a quadrature receiver 10 which also receives reference signals from transmitter 9. Quadrature receiver 10 includes two phase-sensitive detectors each supplied with reference signals having a 90° phase difference between them. Receiver 10 has two outputs being the real and imaginary components of the received signal. Transmitter 9 quadrature receiver 10 and current source and switch 7 are all controlled by a controller 11 to ensure that appropriate frequencies are transmitted from the transmitter in the presence of the requisite gradient fields. The apparatus described so far is well known and examples of sequences of appropriate rf transmitter pulses and switched magnetic field gradients are described in British Patent Specification No. 1596160 (corresponding to U.S. Pat. No. 4,165,479) to give signals relating to a selected slice in an object. These signals require Fourier transformation in order to give a frequency spectrum which corresponds to a spatial distribution in the two dimensions of the slice.

In the apparatus, described and illustrated with respect to FIG. 1, the signal components obtained from the quadrature receiver are digitized in a digitizer 12 and are then modulated numerically in a modulator 13. The digitized signal input to modulator 13 consists of a sequence of complex numbers $S(k_x,k_y)$ each having a real part Re and an imaginary part Im. These numbers represent the signal obtained from a point $(k_x k_y)$ in a reciprocal space associated with a slice in the xy plane that has been selected. In modulator 13 for each input number $S(k_x,k_y)$ a modulated number $T(k_x,k_y)$ is obtained by modulation with an arbitrary period $\lambda$ as follows:

$$T(k_x,k_y) = ReS(k_x,k_y) \cos \lambda k_x - ImS(k_x,k_y) \sin \lambda k_x + A$$

where A is a constant chosen to be sufficiently large to make all values of T always positive.

Figure 2:
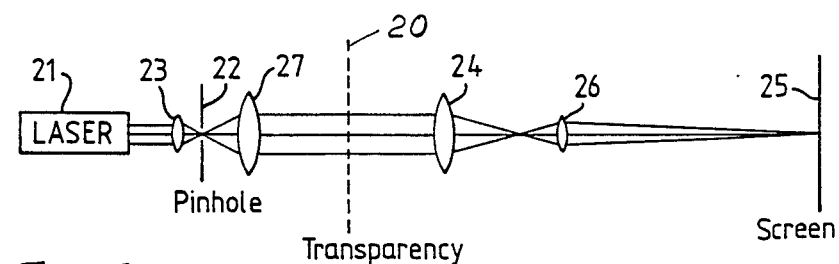
FIG. 2 illustrates optical equipment for use with the apparatus of FIG. 1.

The sequence of values $T(k_x,k_y)$ are displayed in a video monitor 14 in as many shades of grey as possible. The image in monitor 14 is photographed by a camera 15. This camera can conveniently be a simple SLR 35 mm camera with a positive monochrome transparency film. The optics for the display of the transparency are shown in FIG. 2.

The developed transparency 20 obtained from camera 15 is illuminated by a coherent light beam obtained from a laser 21 which is focused onto a pinhole 22 by means of a lens 23 so that the pinhole constitutes a point source. The beam from pinhole 22 is applied to a lens 27 positioned a distance from pinhole 22 equal to its focal length to produce a parallel beam. This beam illuminates the entire image in the transparency and after passing through the transparency is brought to a focal plane by a further lens 24 and subsequently displayed on a screen 25 after magnification by a lens 26 is desired. The image displayed on screen 25 is the spin density distribution of the nuclei of the selected slice in the object. Images may be stored for later analysis using a video camera and subsequently viewed using a video tape recorder.

Alternatively, instead of modulating the signal after detection, modulation may be achieved by providing a fixed offset to the magnitude of the steady magnetic field B so that in the presence of a magnetic field gradient the Larmor frequency of the selected nuclei is no longer at the center of the region of interest. The signal from quadrature receiver 10 which represent the in-phase component of the free induction signal is then added to a DC voltage to ensure a non-negative output. The effective spatial modulation frequency and thus the angular spread of the reconstructed image from the direct laser beam is proportional to the magnetic field offset that is used.

The net signal obtained as described above can then be used to control the intensity of the electron beam in an electron beam scanned spatial light modulator to form the required hologram of the original object. The position of the beam is controlled by signals derived from the two orthogonal magnetic field gradients which extend in the plane of the desired image. For a vertically extending plane the horizontal position of the beam is proportional to the time integral of the horizontal gradient and the vertical position of the beam is proportional to the time integral of the vertical gradient.

The electron-beam-scanned spatial light modulator (EBS-SLM) is a device which converts variations of intensity of an electron beam into variations of optical reflectivity of a screen scanned by that beam. Such a screen may be used as a reflection hologram when illuminated with coherent light to reconstruct an NMR image in a way analogous to that just described. Improved image quality may be obtained by allowing the signals from several consecutive rf pulses to accumulate on the EBS-SLM screen. An example of an EBS-SLM is described in "Electron Beam Addressed Microchannel Spatial Light Modulator" A. Schwartz et al Optical Engineering vol. 24 (1985) at page 119. Another example is described in published PCT Patent Application No. WO 85/01362.

What is claimed is:

1. A method of providing nuclear magnetic resonance images comprising the steps of:
    obtaining a free induction signal from nuclei in an object under investigation in the presence of a homogeneous magnetic field on which a magnetic gradient field is superimposed,
    modulating the free induction signal by a reference signal,
    converting the modulated signal into an optical image, said converting step including intensity modulating an electron beam with said modulated signal and forming an image utilizing the intensity modulated beam,
    illuminating the image with coherent light, and
    focussing light from the image through a lens to constitute an image which is the Fourier transformation of the original image.

2. The method as claimed in claim 1 in which the reference signal comprises a fixed magnetic field offset to the homogeneous magnetic field.

3. The method as claimed in claim 1 in which the conversion of the modulated free induction signal is carried out by using said modulated free induction signal to control the intensity of an electron beam in an electron beam scanned spatial light modulator.

4. The method as claimed in claim 1 in which the free induction signal is digitized prior to modulation.

5. The method as claimed in claim 1 in which the said image is produced as variations in the optical density of a photographic film.

6. The method as claimed in any one of the preceding claims in which the said free induction signal is derived from a slice in the object lying in a plane orthogonal to the direction of the gradient of the said magnetic gradient field.

7. Apparatus for providing nuclear magnetic resonance images comprising:
    means for obtaining a free induction signal from nuclei in an object under investigation in the presence of a homogeneous magnetic field on which a magnetic gradient field is superimposed, means for modulating the free induction signal by a reference signal, means for converting the modulated signal into an optical image, said converting means including means for intensity modulating an electron beam with said modulated signal and means for forming an image utilizing the intensity modulated beam, means for illuminating the image with coherent light and, means including a lens for focussing light from said image to constitute an image which is the Fourier transformation of the original image.

8. Apparatus as claimed in claim 7 in which the said means for modulating comprises means for providing a fixed offset magnetic field to the homogeneous magnetic field.

9. Apparatus as claimed in claim 7 in which an electron beam scanned spatial light modulator is provided together with means for utilizing the modulated free induction signal to control the intensity of the electron beam in the modulator.

10. Apparatus as claimed in claim 7 in which a digitizer means is provided for converting the free induction signal to digital values.

11. Apparatus as claimed in claim 7 in which there are provided means for displaying the modulated free induction signal and a camera for photographing the display signal.

* * * * *